(12) United States Patent
Reznik

(10) Patent No.: US 6,798,040 B2
(45) Date of Patent: Sep. 28, 2004

(54) POWER SEMICONDUCTOR SWITCH

(75) Inventor: Daniel Reznik, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/873,227

(22) Filed: Jun. 4, 2001

(65) Prior Publication Data

US 2002/0048915 A1 Apr. 25, 2002

(30) Foreign Application Priority Data

Dec. 4, 1998 (DE) .......................................... 198 56 104

(51) Int. Cl.⁷ ..................... H01L 27/082; H01L 27/102; H01L 29/70; H01L 31/11
(52) U.S. Cl. ...................... 257/565; 257/556; 257/557; 257/560; 257/563; 257/564; 257/575
(58) Field of Search ................................ 257/565, 152, 257/163, 169, 176, 144, 145, 580, 591, 556, 557, 560, 563, 564, 575

(56) References Cited

U.S. PATENT DOCUMENTS

| | | | | |
|---|---|---|---|---|
| 4,097,888 A | * | 6/1978 | Russell | 257/575 |
| 4,107,721 A | * | 8/1978 | Miller | 257/462 |
| 4,866,315 A | * | 9/1989 | Ogura et al. | 327/376 |
| 4,888,627 A | * | 12/1989 | Pattanayak et al. | 257/113 |
| 4,893,165 A | * | 1/1990 | Miller et al. | 257/156 |
| 4,901,127 A | * | 2/1990 | Chow et al. | 257/378 |
| 4,920,062 A | * | 4/1990 | Tsunoda | 438/137 |
| 4,990,975 A | * | 2/1991 | Hagino | 257/142 |
| 5,025,293 A | * | 6/1991 | Seki | 257/142 |
| 5,151,762 A | * | 9/1992 | Uenishi et al. | 257/133 |
| 5,210,432 A | * | 5/1993 | Shinohe et al. | 257/152 |
| 5,324,966 A | * | 6/1994 | Muraoka et al. | 257/136 |
| 5,341,003 A | * | 8/1994 | Obinata | 257/135 |
| 5,396,087 A | * | 3/1995 | Baliga | 257/139 |
| 5,528,058 A | * | 6/1996 | Pike et al. | 257/142 |
| 5,608,237 A | | 3/1997 | Aizawa et al. | |
| 5,614,738 A | * | 3/1997 | Iwamuro | 257/147 |
| 5,654,561 A | * | 8/1997 | Watabe | 257/139 |
| 5,766,966 A | | 6/1998 | Ng | |
| 5,891,776 A | * | 4/1999 | Han et al. | 438/274 |
| 5,923,055 A | * | 7/1999 | Schlangenotto et al. | 257/147 |
| 5,939,759 A | * | 8/1999 | Arnborg | 257/378 |
| 6,278,140 B1 | * | 8/2001 | Harada et al. | 257/133 |
| 6,423,986 B1 | * | 7/2002 | Zhao | 257/138 |

FOREIGN PATENT DOCUMENTS

| | | |
|---|---|---|
| EP | 0 837 508 A2 | 4/1998 |
| WO | WO 98/38681 | 9/1998 |

OTHER PUBLICATIONS

M. Mori et al.: "A Novel High–Conductivity IGBT (HiGT) with a Short Circuit Capability", Proceedings of 1998 International Symopsium on Power Semiconductor Devices & ICs, Kyoto, Japan, pp.429–432, XP–000801108.*

M. Mori et al.: "A Novel High–Conductivity IGBT (HiGT) with a Short Circuit Capability", *Proceedings of 1998 International Symopsium on Power Semiconductor Devices & ICs*, Kyoto, Japan, pp. 429–432, XP–000801108.

* cited by examiner

Primary Examiner—Amir Zarabian
Assistant Examiner—Ida M. Soward
(74) Attorney, Agent, or Firm—Laurence A. Greenberg; Werner H. Stemer; Ralph E. Locher

(57) ABSTRACT

An IGBT structure includes successive regions whose conductivities have alternating signs. The structure is dimensioned for punch-through and is provided with two buffer layers. As a result, the component becomes symmetrically blocking and is suitable as a semiconductor switch, e.g., for converters.

6 Claims, 1 Drawing Sheet

POWER SEMICONDUCTOR SWITCH

The present invention relates to an IGBT (Insulated Gate Bipolar Transistor) which is suitable for forming bidirectional switches.

BACKGROUND OF THE INVENTION

Field of the Invention

The invention lies in the field of semiconductor circuits.

Commercially available IGBTs can be used to construct bidirectional switches which are used e.g. in converters, by each IGBT being connected in series with a diode. In this case, the forward direction of the diode corresponds to the switchable current direction of the IGBT. This circuit therefore effects blocking in the reverse direction. However, high on-state losses have to be accepted with this. U.S. Pat. No. 5,608,237 describes a bidirectional semiconductor switch comprising IGBTs in which IGBT structures are formed on two mutually opposite main sides of a semiconductor body. The dimensioning of such proposals for bidirectionally blocking switches is in each case chosen in such a way as to produce an NPT component (Non Punch Through). A triangular field profile builds up in the component under blocking loading. Other symmetrically blocking components such as e.g. thyristors or GTOs likewise have a non-punch-through dimensioning. That requires the component to have a large thickness and thus increases the switching and on-state losses in relation to the thinner punch-through dimensioning.

The invention provides a power semiconductor switch that overcomes the hereinafore-mentioned disadvantages of the heretofore-known devices of this general type and that is simpler in construction and that can block high voltages in both directions.

In the case of the component according to the invention, a conventional structure of a power semiconductor switch, e.g. of an IGBT, is provided with an additional buffer layer on the source side and dimensioned in such a way that, in an operating state in which the component effects blocking, at least in a range of high electrical voltages which are applied to source and drain, a space charge zone produced in the semiconductor body extends as far as the respective buffer layer in accordance with a punch-through dimensioning. By virtue of the buffer layers present on both sides, the advantage of punch-through dimensioning (small thickness of the component) is combined with the advantage of non-punch-through dimensioning (possibility of symmetrical blocking capability).

DESCRIPTION OF THE PREFERRED EMBODIMENTS

Figure 1:
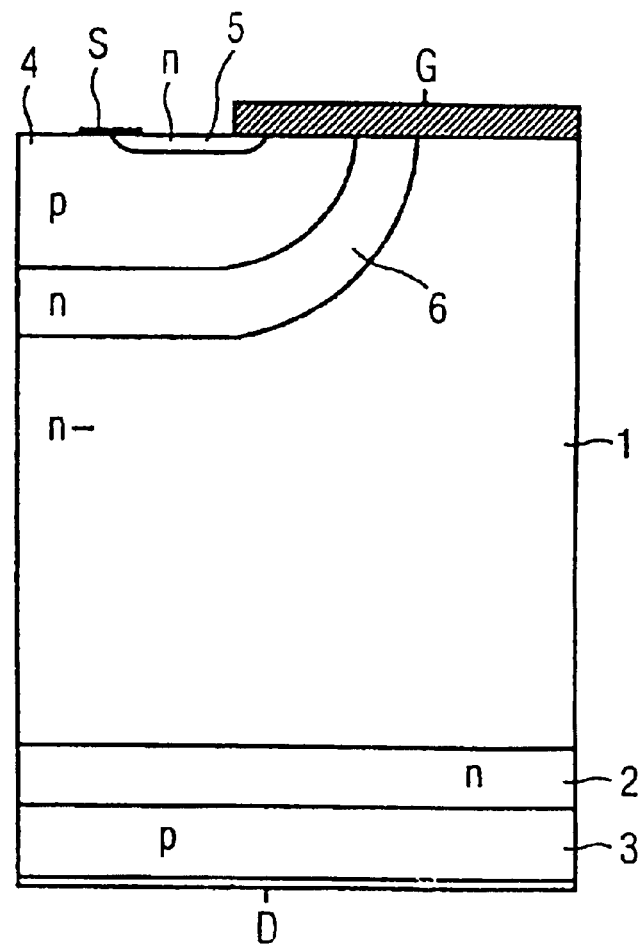
FIG. 1 is a diagrammatic cross-sectional view of a semiconductor structure according to the invention.

Referring now to the figures of the drawings in detail and first, particularly to FIG. 1 thereof, there is shown a cross-sectional detail from an IGBT structure. A first base region 1 is essentially formed by the semiconductor body provided with a basic doping. The basic doping is preferably a doping for weak n-type conductivity. In accordance with conventional IGBT structure, also present are a second base region 4 of opposite sign and emitter regions 3, 5. The sequence of these regions has conductivities having alternating signs in the vertical direction. In the second base region 4, which is formed in a manner extending as far as the top side of the semiconductor body, a channel is formed on the top side, which channel can be controlled by a gate electrode G applied above the channel and preferably isolated from the channel by a dielectric. The second base region 4 is preferably formed as a p-conducting doped well in the n⁻-conducting doped semiconductor body. Situated within the well is the region 5 doped oppositely thereto (in the example shown, the region 5 is n-conducting). The emitter region 5 is connected to the source contact S. The source contact S also makes contact with the second base region 4.

Situated on the rear side of the component is a further doped region 3, which, as an emitter region, is doped oppositely to the first base region 1 and is provided with a drain contact D. In accordance with a conventional punch-through dimensioning, the thickness of the semiconductor body is chosen to be smaller than in IGBTs with non-punch-through dimensioning, and a buffer layer 2 whose conductivity has the same sign as that of the first base region 1 is disposed between the first base region 1 and the region provided with the drain contact (p-type emitter). The buffer layer 2 is preferably doped with a dose of $1\times10^{12}$ cm$^{-2}$ to $4\times10^{12}$ cm$^{-2}$ (integral over the doping profile). In the blocking operating state of the component, in contrast to a conventional layer structure with buffer layer, the electric field for the most part falls in the first base region 1.

Figure 2:
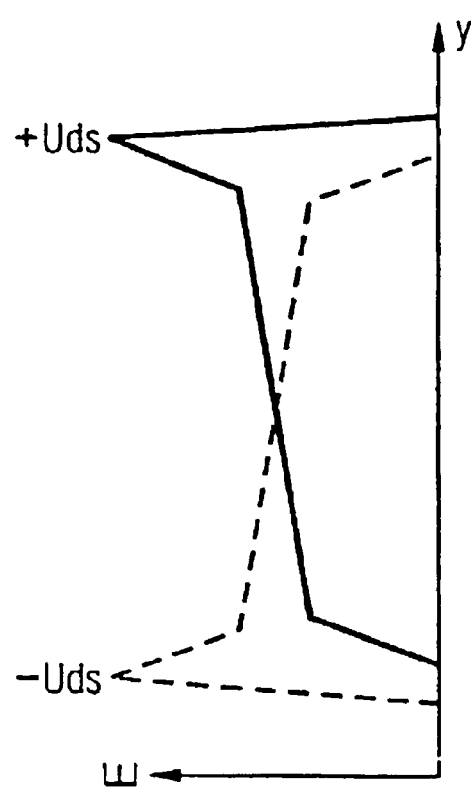
FIG. 2 is graph showing a profile of the electric field against the vertical direction of the structure of FIG. 1 for different polarities.

A typical profile of the electric field in the vertical direction of the component is illustrated in FIG. 2 for the case where the drain terminal is positive relative to the source terminal (solid curve in the y-E diagram).

What is essential to the invention is a further buffer layer 6, which is present between the first base region 1 and the second base region 4 and is doped such that its electrical conductivity has the same sign as that of the first base region 1 (basic doping of the semiconductor body). This further buffer layer 6, which is n-conducting in this example, is doped so highly (most preferably with a dose of $1\cdot10^{12}$ cm$^{-2}$ to $4\cdot10^{12}$ cm$^{-2}$) that, in the event of polarity reversal of the voltage between drain and source, a profile of the electric field in the vertical direction of the component is produced which, in principle, corresponds to the broken curve depicted in the diagram on the left-hand side of the FIGURE. To an extent, the punch-through case for the opposite direction is present here, with the result that this component also blocks high voltages in both directions. The blocking operating state is changed over, in a manner known per se, into the operating state open from source to drain, by means of the control of the channel via the gate electrode. Therefore, according to the invention, a component is present which constitutes a switch in a current direction and blocks the current in the opposite direction up to high voltages.

The basic doping of the semiconductor body is preferably chosen to be somewhat lower than is otherwise customary (e.g., for 1200 V IGBTs, 90 Ωcm instead of 60 Ωcm). The thickness and the magnitude of the doping in the first base region 1 and the two buffer layers 2, 6 must be accurately dimensioned; in the case of an excessively high doping and/or thickness of the layers, a premature breakdown takes place on account of the avalanche multiplication of the charge carriers (avalanche effect) and, in the case of an excessively low doping of the buffer layers, a breakdown takes place on account of punch-through of the blocked PNP transistor. In the case of correct dimensioning, which can easily be found using the customary procedures for the respective exemplary embodiment, it is possible to reduce the thickness of the component. In addition, the further buffer layer 6 under the p-conducting doped well in the semiconductor body brings about an elevation of the charge carrier density in this region, with the result that the switching losses are reduced and an improvement by approximately 30–40% with the on-state losses remaining the same is possible. As a result, it is possible to realize a symmetrically blocking 1200 V IGBT, and likewise symmetrically blocking thyristors or GTOs.

What is claimed is:

1. A semiconductor component, comprising:
   a semiconductor body having:
      first and second main sides;
      four doped regions with conductivities having alternating signs formed one above another between said first and second main sides;
      a gate electrode disposed on said first main side;
      a source contact;
      a drain contact;
   one of said four doped regions being a weakly doped first base region with a given conductivity type;
   another of said four doped regions being a second base region having a conductivity type with an opposite sign with respect to said given conductivity type, said second base region extending as far as said first main side, having a channel and having said gate electrode for controlling said channel;
   two remaining regions of said four doped regions being respectively connected to one of said source contact and said drain contact;
   said source contact being connected to said second base region and being disposed on said first main side;
   a buffer layer being doped to have said given conductivity type, said buffer layer being disposed between said first base region and one of said two remaining regions connected to said drain contact;
   said first base region being dimensioned and a magnitude of a doping of said buffer layer being chosen such that, in an operating state in which the semiconductor component effects blocking in a direction from said source contact toward said drain contact, at least in an envisaged range of applied electrical voltages, a space charge zone present in said first base region is formed in a manner extending at least as far as said buffer layer; and
   a further buffer layer being doped to have said given conductivity type and being disposed between said first base region and said second base region, a doping of said further buffer layer having a magnitude causing the semiconductor component to block in a direction from said drain contact toward said source contact in an envisaged range of opposite applied electrical voltages.

2. The component according to claim 1, wherein said magnitude of said doping of said further buffer layer is chosen such that, in an operating state in which the semiconductor component effects blocking in said direction from said drain contact toward said source contact, at least in an envisaged range of applied electrical voltages, a space charge zone present in said first base region is formed in a manner extending at least as far as said further buffer layer.

3. A semiconductor component, comprising:
   a semiconductor body having:
      first and second main sides;
      a gate electrode disposed on said first main side;
      a source contact;
      a drain contact disposed on said second main side;
   a first base region having a weak doping with a given conductivity type;
   a second base region having a conductivity type opposite said given conductivity type and a channel, said second base region extending from said first main side into said semiconductor body and having said gate electrode for controlling said channel;
   a third region having a conductivity type opposite said given conductivity type and being connected to said drain contact;
   a fourth region having said given conductivity type and being connected to said second base region;
   said source contact being disposed on said first main side and being connected to said fourth region and to said second base region;
   a buffer layer being doped to have said given conductivity type, said buffer layer being disposed between said first base region and said third region;
   a further buffer layer being doped to have said given conductivity type and being disposed between said first base region and said second base region;
   said first base region being dimensioned and a magnitude of a doping of said buffer layer being chosen such that, in an operating state in which the semiconductor component effects blocking in a direction from said source contact toward said drain contact, at least in an envisaged range of applied electrical voltages, a space charge zone present in said first base region is formed in a manner extending at least as far as said buffer layer; and
   a doping of said further buffer layer having a magnitude causing the semiconductor component to block in a direction from said drain contact toward said source contact in an envisaged range of opposite applied electrical voltages.

4. The component according to claim 3, wherein said magnitude of said doping of said further buffer layer is chosen such that, in an operating state in which the semiconductor component effects blocking in said direction from said drain contact toward said source contact, at least in an envisaged range of applied electrical voltages, a space charge zone present in said first base region is formed in a manner extending at least as far as said further buffer layer.

5. A method for creating a power semiconductor switch, which comprises:
   providing a semiconductor body having a first main side and a second main side;
   producing, in the semiconductor body, a weakly-doped first base region having a given conductivity type;
   producing a buffer layer on the second main side of the first base region, and doping the buffer layer to have the given conductivity type
   producing a third region on the buffer layer such that the buffer layer is disposed between the first base region and the third region, and doping the third region to have a conductivity type opposite the given conductivity type;
   connecting a drain contact to the third region;
   producing a further buffer layer on a first main side of the first base region and doping the further buffer layer to have the given conductivity type;

producing a second base region extending from the first main side into the semiconductor body to the further buffer layer such that the further buffer layer is disposed between the first base region and the second base region, and doping the second base region to have the conductivity type opposite the given conductivity type;

producing a fourth region at the second base region on the first main side, and doping the fourth region to have the given conductivity type;

connecting a gate electrode to the second base region on the first main side;

connecting a source contact to the fourth region and the second base region on the first main side;

controlling a channel in the second base region with the second base region;

dimensioning the first base region and choosing a magnitude of a doping of the buffer layer such that, in an operating state in which the semiconductor component effects blocking in a direction from the source contact toward the drain contact, at least in an envisaged range of applied electrical voltages, a space charge zone present in the first base region is formed in a manner extending at least as far as the buffer layer; and choosing a magnitude of a doping of the further buffer layer such that the semiconductor component effects blocking in a direction from the drain contact toward the source contact in an envisaged range of opposite applied electrical voltages.

6. The method according to claim 5, which further comprises choosing the magnitude of the doping of the further buffer layer such that, in an operating state in which the semiconductor component effects blocking in the direction from the drain contact toward the source contact, at least in an envisaged range of applied electrical voltages, a space charge zone present in the first base region is formed in a manner extending at least as far as the further buffer layer.

* * * * *

UNITED STATES PATENT AND TRADEMARK OFFICE
CERTIFICATE OF CORRECTION

PATENT NO.     : 6,798,040 B2
DATED          : September 28, 2004
INVENTOR(S)    : Daniel Reznik It is certified that error appears in the above-identified patent and that said Letters Patent is hereby corrected as shown below:

<u>Title page</u>,
Item [63], Related U.S. Application Data, should read as follows:
-- Continuation of application No. PCT/DE99/03836, filed on Dec. 1, 1999. --

Signed and Sealed this

Fifteenth Day of March, 2005

JON W. DUDAS
*Director of the United States Patent and Trademark Office*